United States Patent
Lee

(10) Patent No.: US 7,551,504 B2
(45) Date of Patent: Jun. 23, 2009

(54) APPARATUS AND METHOD OF DETECTING REFRESH CYCLE OF SEMICONDUCTOR MEMORY

(75) Inventor: Kyong-Ha Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 375 days.

(21) Appl. No.: 11/638,363

(22) Filed: Dec. 14, 2006

(65) Prior Publication Data

US 2007/0237017 A1 Oct. 11, 2007

(30) Foreign Application Priority Data

Apr. 6, 2006 (KR) ............... 10-2006-0031399

(51) Int. Cl.
*G11C 7/00* (2006.01)
(52) U.S. Cl. .................. 365/222; 365/189.09
(58) Field of Classification Search ............ 365/222, 365/189.09
See application file for complete search history.

(56) References Cited

U.S. PATENT DOCUMENTS 5,299,157 A * 3/1994 Kimura et al. ........ 365/189.02
5,495,452 A    2/1996 Cha
6,288,963 B1 * 9/2001 Kato ................... 365/222
6,834,021 B2 * 12/2004 Mori et al. ............ 365/222
6,967,886 B2 * 11/2005 Huang et al. ......... 365/222
2006/0023545 A1 2/2006 Ito et al.

FOREIGN PATENT DOCUMENTS

| JP | 1194193 | 8/1989 |
|---|---|---|
| JP | 2005166149 | 6/2005 |
| JP | 2006031860 | 2/2006 |
| KR | 1020040101677 A | 12/2004 |

* cited by examiner

*Primary Examiner*—Tuan T. Nguyen
(74) *Attorney, Agent, or Firm*—Venable LLP; Jeffri A. Kaminski

(57) ABSTRACT

An apparatus for detecting a refresh period of a semiconductor memory includes a signal generating unit that generates a plurality of signal pairs, each of which includes one among a plurality of first reference signals that are respectively generated with the same timing as first to (N−1)-th pulses of a refresh period signal of order N, and one among a plurality of second reference signals that correspond to the plurality of first reference signals and are respectively generated with the same timing as second to N-th pulses of the refresh period signal. A refresh period detecting unit detects the period of the refresh period signal using one among the plurality of signal pairs.

33 Claims, 7 Drawing Sheets

APPARATUS AND METHOD OF DETECTING REFRESH CYCLE OF SEMICONDUCTOR MEMORY

CROSS-REFERENCE TO RELATED APPLICATIONS

This U.S. non-provisional patent application claims priority under 35 U.S.C. § 119 of Korean Patent Application No. 2006-031399 filed on Apr. 6, 2006, the entire contents of which are hereby incorporated by reference.

BACKGROUND OF THE INVENTION

1. Technical Field

The present invention relates to a semiconductor memory, and more particularly, to an apparatus and method of detecting a refresh period of a semiconductor memory.

2. Related Art

As shown in FIG. 1, an apparatus for detecting a refresh period of a semiconductor memory according to the related art includes a first NAND gate ND11 that receives a self refresh pulse (hereinafter, referred to as SREF_PULSE) generated according to a self refresh entering command and a test mode signal (hereinafter, referred to as TM_REFOSC), a second NAND gate ND12 that receives a self refresh period signal (hereinafter, referred to as OSC) and the TM_REFOSC, a latch circuit 11 that maintains a voltage level of the output signal of the first NAND gate ND11 according to the output of the second NAND gate ND12 and outputs a refresh period detecting signal (hereinafter, referred to as MEAS_OSC), an inverter IV11 that receives the TM_REFOSC, and a transistor M11 having a drain coupled with an output terminal of the latch circuit 11, a source connected to ground, and a gate receiving the output of the inverter IV11.

The operation of the apparatus for detecting a refresh period of a semiconductor memory according to the related art that has the above-described structure will be described with reference to FIG. 2.

When the TM_REFOSC is enabled and the SREF_PULSE is generated, the voltage level of the MEAS_OSC changes from a low level to a high level.

Then, when a first self refresh period signal OSC is generated, the voltage level of the MEAS_OSC changes from a high level to a low level.

Since a high level interval of the MEAS_OSC signal is a self refresh period to be measured, the MEAS_OSC signal is read from the semiconductor memory test equipment, and a self refresh period test is performed.

The apparatus for detecting a refresh period of a semiconductor memory according to the related art detects a self refresh period using a first output of an oscillator that generates the self refresh period after entering a self refresh mode. However, since the oscillator operates right after entering the self refresh mode, an initial output waveform is unstable and the self refresh period is detected from the unstable waveform, which it is not possible to perform normal period detection with. As a result, the self refresh period may be unstable, which leads to data loss.

SUMMARY OF THE INVENTION

Embodiments of the present invention provide an apparatus and method of detecting a refresh period of a semiconductor memory that can stably detect a refresh period.

A first embodiment of the present invention provides an apparatus for detecting a refresh period of a semiconductor memory including: a signal generating unit configured to generate a plurality of signal pairs, each of which includes one among a plurality of first reference signals that are respectively generated with the same timing as first to (N−1)-th pulses of a refresh period signal of order N, and one among a plurality of second reference signals that correspond to the plurality of first reference signals and are respectively generated with the same timing as second to N-th pulses of the refresh period signal; and a refresh period detecting unit configured to detect the period of the refresh period signal using one among the plurality of signal pairs.

A second embodiment of the present invention provides an apparatus for detecting a refresh period of a semiconductor memory including: a signal generating unit configured to generate a first reference signal having the same enable timing as a (N−1)th pulse of a refresh period signal of order N using a first pulse of the refresh period signal in which pulses are periodically generated, and a second reference signal having the same enable timing as an N-th pulse corresponding to an order of a pulse subsequent to the first pulse among the pulses of the refresh period signal; and a refresh period detecting unit configured to detect the period of the refresh period signal using the first reference signal and the second reference signal.

A third embodiment of the present invention provides a method of detecting a refresh period of a semiconductor memory including: generating a plurality of reference signals that are respectively synchronized with at least two pulses corresponding to pulses subsequent to a first pulse of a refresh period signal of order N in which pulses are generated with a predetermined period; and selecting one from the plurality of reference signals, and detecting the period of the refresh period signal using a pulse of the refresh period signal that is generated at timing before the timing of the selected reference signal.

A fourth embodiment of the present invention provides a method of detecting a refresh period of a semiconductor memory including: generating a pulse having the same enable timing as a second pulse of a refresh period signal of order N, using a first pulse of the refresh period signal in which pulses are periodically generated; generating, using the pulse, a first reference signal having the same enable timing as an (N−1)th pulse corresponding to an order of a pulse subsequent to the first pulse of the refresh period signal and a second reference signal having the same enable timing as an N-th pulse of the refresh period signal; and detecting the period of the refresh period signal using the first reference signal and the second reference signal.

DESCRIPTION OF EXEMPLARY EMBODIMENTS

Embodiments of the present invention will now be described in detail with reference to the accompanying drawings.

Figure 1:
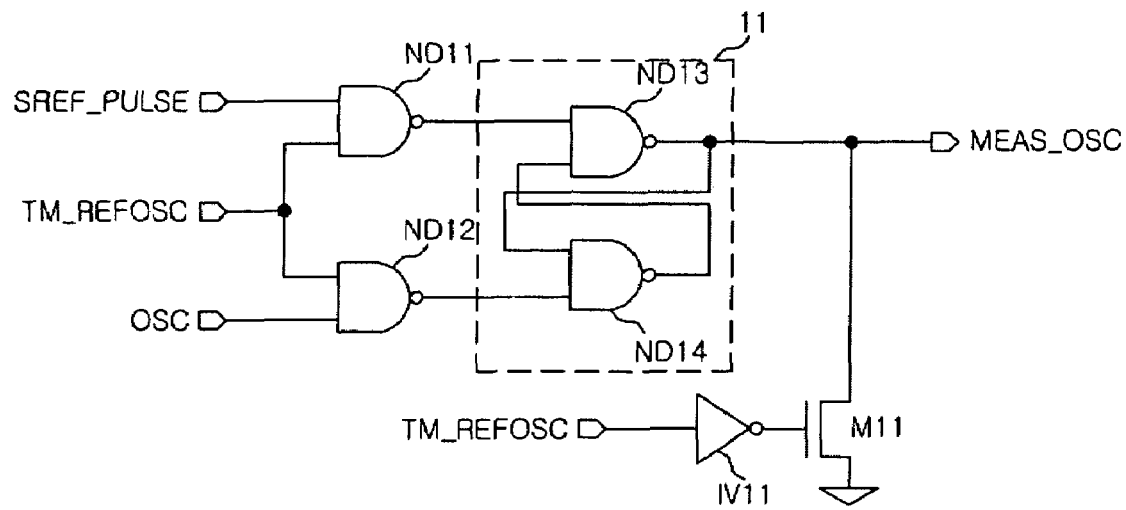
FIG. 1 is a circuit diagram illustrating the structure of an apparatus for detecting a refresh period of a semiconductor memory according to the related art.
Figure 2:
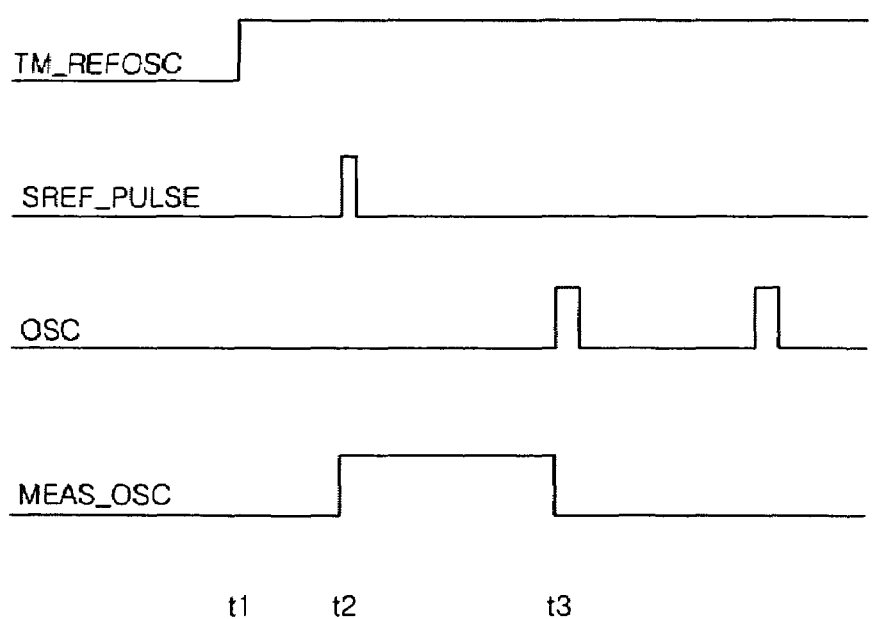
FIG. 2 is a timing chart illustrating the operation of an apparatus for detecting a refresh period of a semiconductor memory according to the related art.
Figure 3:
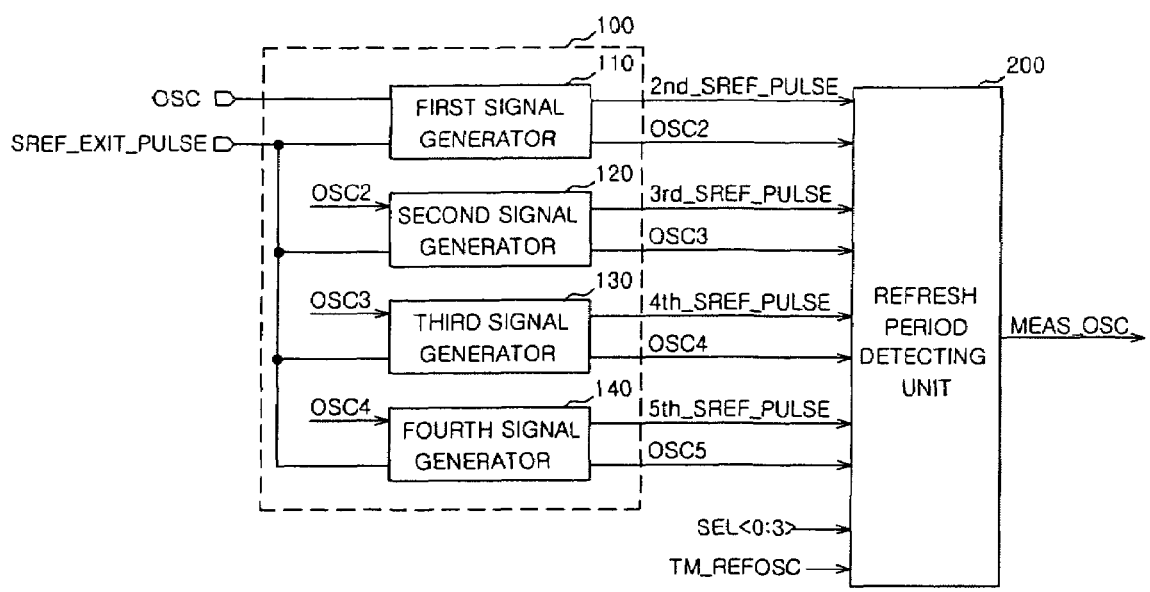
FIG. 3 is a block diagram illustrating the structure of an apparatus for detecting a refresh period of a semiconductor memory according to a first embodiment of the present invention.

As shown in FIG. 3, an apparatus for detecting a refresh period of a semiconductor memory according to a first embodiment of the present invention includes a signal generating unit 100 and a refresh period detecting unit 200. The signal generating unit 100 generates a plurality of signal pairs 2nd_SREF_PULSE/OSC2 to 5th_SREF_PULSE/OSC5, each of which includes one among a plurality of first reference signals 2nd_SREF_PULSE to 5th_SREF_PULSE that are respectively generated with the same timing as the first to (N−1)th pulses (n=5 in the first embodiment) of a refresh period signal of order N (hereinafter, referred to as OSC), and one among a plurality of second reference signals OSC2 to OSC5 that correspond to the plurality of first reference signals, respectively, and are generated with a timing that corresponds to the second to N-th pulses of the OSC. The refresh period detecting unit 200 detects the period of the OSC using one among the plurality of signal pairs.

When it is assumed that a semiconductor memory is stabilized after an initial operation and enters a normal operation state, the OSC pulse is generated after a self refresh pulse SREF_PULSE is generated. The OSC pulse has a uniform period according to the self refresh pulse SREF_PULSE. The order of the plurality of first reference signals 2nd_SREF_PULSE to 5th_SREF_PULSE is arbitrarily determined, assuming that the pulses are generated at a timing when the second to fifth pulses of the OSC are generated. Further, each of the plurality of second reference signals OSC2 to OSC5 is a signal in which periodic pulse generation starts from the same timing as each of the second to fifth pulses of the OSC.

As described above, since the condition N=5 is satisfied in the first embodiment, the signal generating unit 100 includes first to fourth signal generators 110 to 140. The number of signal generators may be increased or decreased, if necessary. Since the first to fourth signal generators 110 to 140 have the same internal circuit structure, the structures of the first and second signal generators 110 and 120 will be described below.

Figure 4:
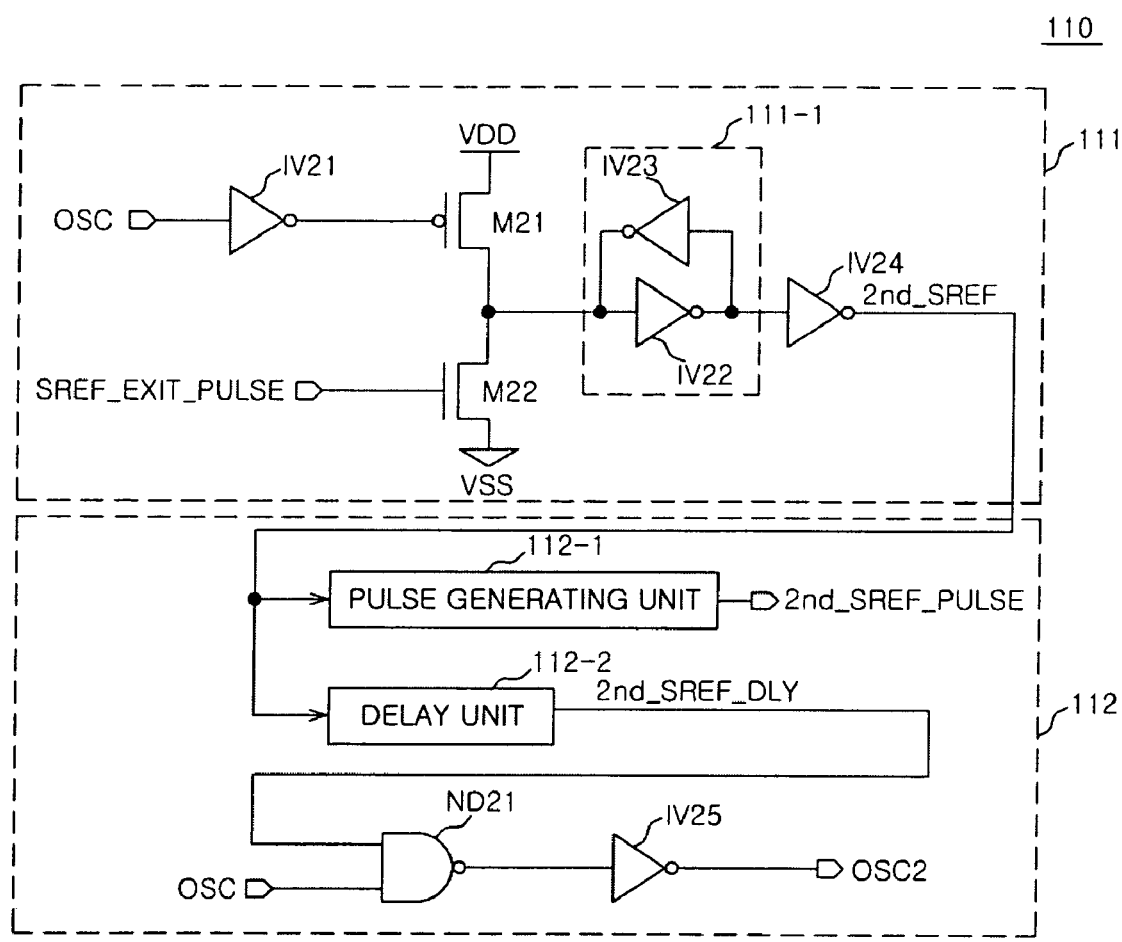
FIG. 4 is a circuit diagram illustrating the structure of the first signal generator of FIG. 3.

As shown in FIG. 4, the first signal generator 110 includes a detecting unit 111 that detects the pulse enable timing of the OSC and outputs a detecting signal (hereinafter, referred to as 2nd_SREF), and a reference signal output unit 112 that generates the 2nd_SREF_PULSE and OSC2 using the 2nd_SREF. The detecting unit 111 includes a first inverter IV21 that receives the OSC, a first transistor M21 having a source coupled with a power supply terminal and a gate receiving the output of the first inverter IV21, a latch circuit 111-1 that includes a second inverter IV22 and a third inverter IV23 and is coupled with the drain of the first transistor M21, a fourth inverter IV24 that receives the output of the latch circuit 111-1, and a second transistor M22 having a drain coupled with the drain of the first transistor M21, a source coupled with a ground terminal, and a gate receiving a refresh completing command (hereinafter, referred to as SREF_EXIT_PULSE), and resets the output of the latch 111-1. The reference signal output unit 112 includes a pulse generating unit 112-1 that generates the 2nd_SREF_PULSE in response to the output of the fourth inverter IV24 of the detecting unit 111, a delay unit 112-2 that delays the 2nd_SREF for a predetermined time, a NAND gate ND21 that receives the output of the delay unit 112-2 and the OSC, and a fifth inverter IV25 that receives the output of the NAND gate ND21 and outputs the OSC2.

Figure 5:
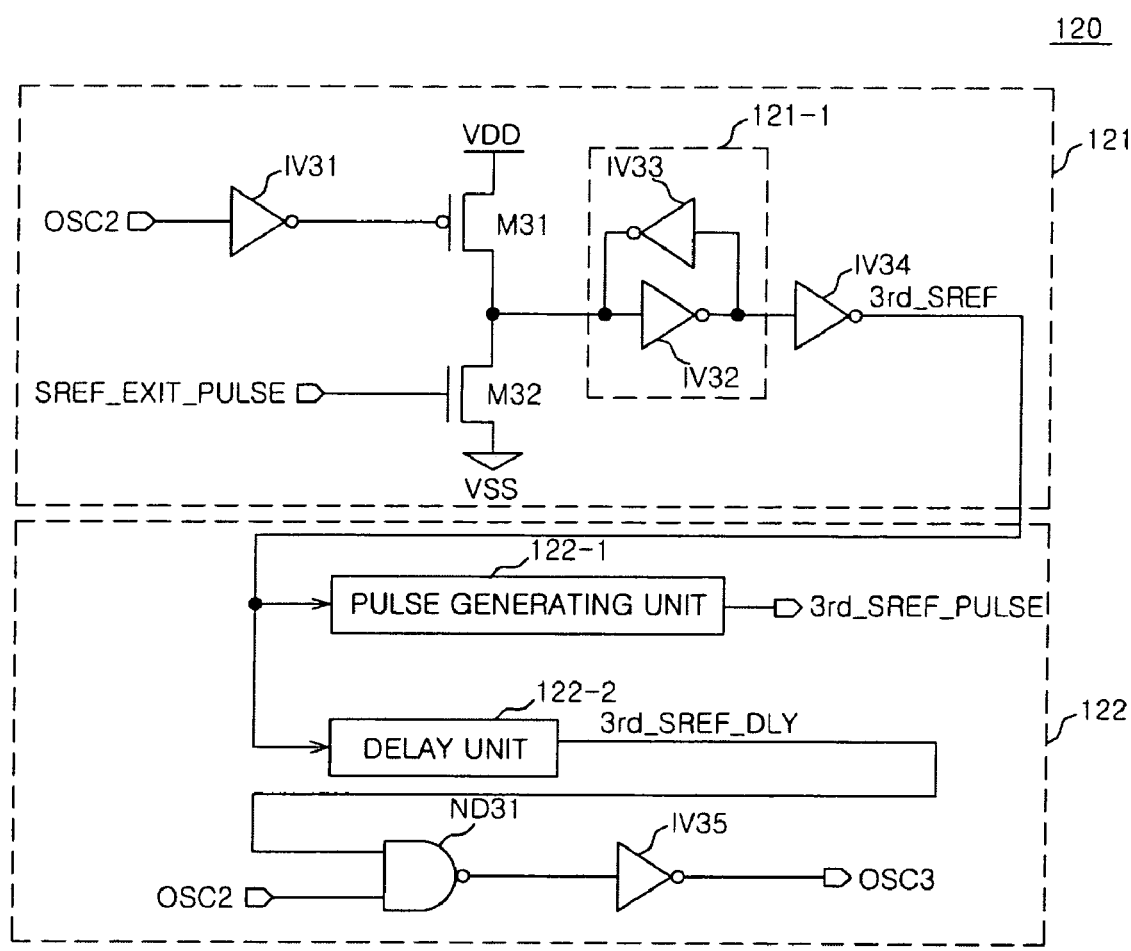
FIG. 5 is a circuit diagram illustrating the structure of the second signal generator of FIG. 3.

As shown in FIG. 5, the second signal generator 120 includes a detecting unit 121 that detects the pulse enable timing of the OSC2 and outputs a detecting signal 3rd_SREF, and a reference signal output unit 122 that generates the 3rd_SREF_PULSE and OSC3 using the 3rd_SREF. The detecting unit 121 includes a first inverter IV31 that receives the OSC2, a first transistor M31 having a source coupled with a power supply terminal and a gate receiving the output of the first inverter IV31, a latch circuit 121-1 that includes a second inverter IV32 and a third inverter IV33 and is coupled with a drain of the first transistor M31, a fourth inverter IV34 that receives the output of the latch 121-1, and a second transistor M32 having a drain coupled with the drain of the first transistor M31, a source coupled with a ground terminal, and a gate receiving the SREF_EXIT_PULSE, and resets output of the latch circuit 121-1. The reference signal output unit 122 includes a pulse generating unit 122-1 that generates the 3rd_SREF_PULSE in response to the output of the fourth inverter IV34 of the detecting unit 120, a delay unit 122-2 that delays the 3rd_SREF for a predetermined time, a NAND gate ND31 that receives the output of the delay unit 122-2 and the OSC2, and a fifth inverter IV35 that receives the output of the NAND gate ND31 and outputs the OSC3.

Figure 6:
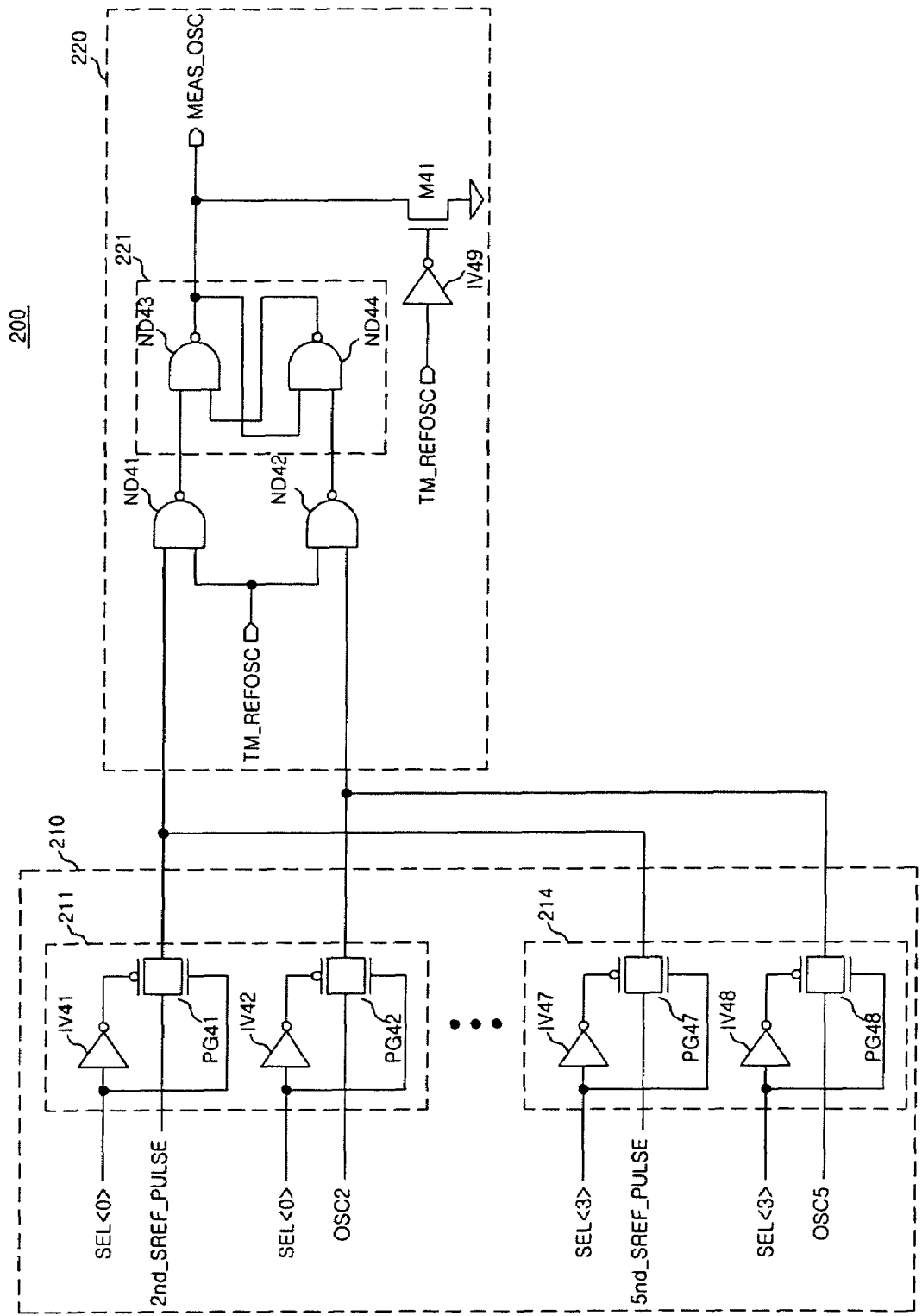
FIG. 6 is a circuit diagram illustrating the structure of the refresh period detecting unit of FIG. 3.

As shown in FIG. 6, the refresh period detecting unit 200 includes a selecting unit 210 and a period detecting unit 220. The selecting unit 210 selects one among the plurality of signal pairs 2nd_SREF_PULSE/OSC2 to 5th_SREF_PULSE/OSC5 in response to a selection signal (hereinafter, SEL<0:3>), and the period detecting unit 220 detects the period of the OSC using the signal pair selected by the selecting unit 210.

The SEL<0:3> enables a predetermined value to be output when a test mode progresses by mode register setting. Further, the SEL<0:3> may be provided from the test equipment through a predetermined pad. The value of the SEL<0:3> may be freely determined according to an operational characteristic of the semiconductor memory.

The selecting unit 210 includes a plurality of switching units 211 to 214, each of which receives one signal pair from the plurality of signal pairs and outputs the signal pair according to a bit corresponding to each switching unit in the SEL<0:3>.

Since the switching units 211 to 214 have the same structure, the structure of only one switching unit 211 will be described below. The switching unit 211 has a first pass gate PG41 that has an input terminal receiving 2nd_SREF_PULSE, a first control terminal receiving the SEL<0> through an inverter IV41, and a second control terminal receiving the SEL<0>; and a second pass gate PG42 that has an input terminal receiving the OSC2, a first control terminal receiving the SEL<0> through an inverter IV42, and a second control terminal receiving the SEL<0>.

The period detecting unit 220 includes a first NAND gate ND41 that receives a first reference signal output by the selecting unit 210 and a test mode signal (hereinafter, TM_REFOSC), a second NAND gate ND42 that receives a second reference signal output by the selecting unit 210 and the TM_REFOSC, a latch circuit 221 that receives the output of the first NAND gate ND41 and the second NAND gate ND42, and outputs a period detecting signal (hereinafter, referred to as MEAS_OSC) in which a predetermined level is maintained during a period ranging from a time point when the first reference signal becomes enabled to a time point when the second reference signal becomes enabled, an inverter IV49 that receives the TM_REFOSC, and a transistor M41 having a drain coupled with an output terminal of the latch circuit 221, a source coupled with a ground terminal, and a gate receiving output of the inverter IV49.

The latch circuit 221 includes a third NAND gate ND43 whose first input terminal receives the output of the first NAND gate ND41; and a fourth NAND gate ND44 that receives the output of the second NAND gate ND42 and the third NAND gate ND43, and which outputs a signal to a second input terminal of the third NAND gate ND43. When the TM_REFOSC is disabled to a low level, the transistor M41 resets the MEAS_OSC to a low level.

The operation of the first embodiment of the present invention that has the above-described structure will now be described with reference to FIG. 7.

First, the first to fourth signal generators 110 to 140 of the signal generating unit 100 output signal pairs 2nd_SREF_PULSE/OSC2 to 5th_SREF_PULSE/OSC5 including the first and second reference signals.

The operation of the second signal generator 120 of the first to fourth signal generators 110 to 140 will be described below.

First, the detecting unit 121 detects the generation of a first pulse of the OSC2 and outputs a high level signal. That is, the first inverter IV31 outputs a low level signal and the first transistor M31 is turned on. Therefore, the 3rd_SREF is output at a high level, that is, at a VDD level, through the latch 121-1 and the fourth inverter IV34.

Figure 7:
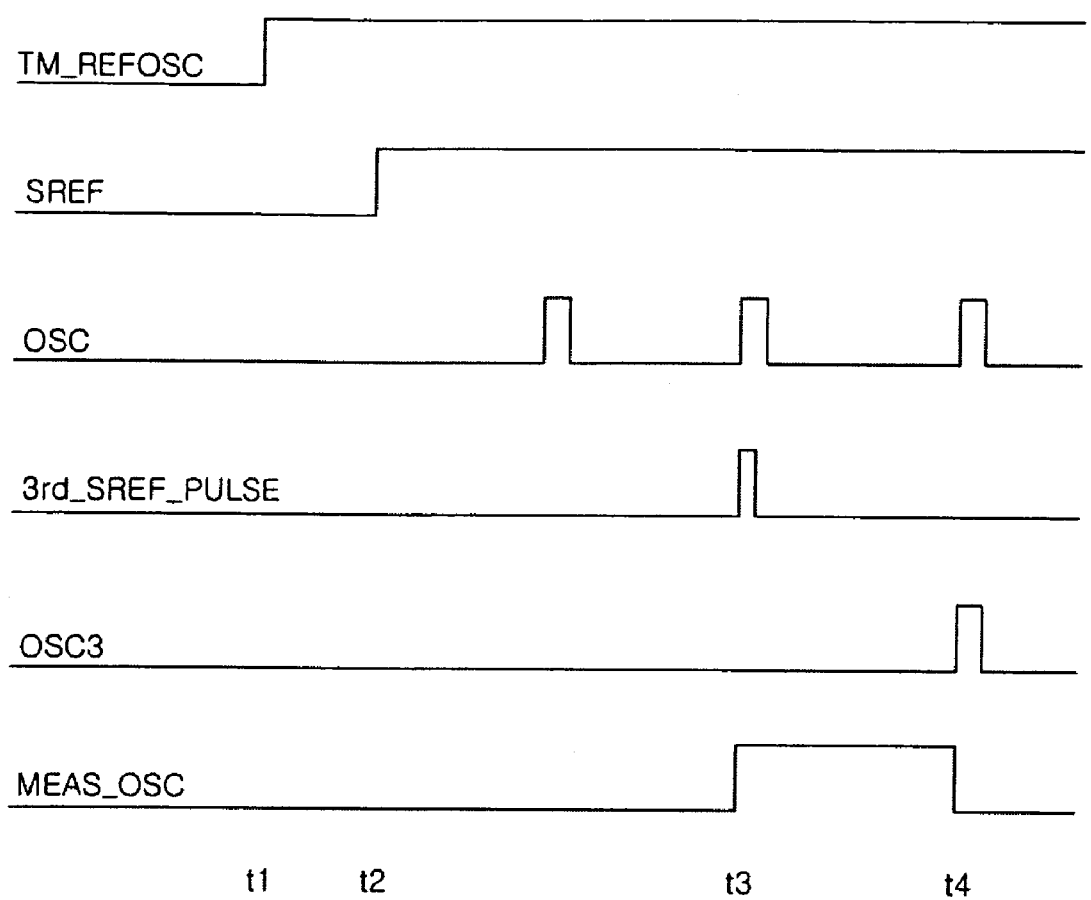
FIG. 7 is a timing chart illustrating the operation of an apparatus for detecting a refresh period of a semiconductor memory according to the first embodiment of the present invention.

Then, as shown in FIG. 7, the reference signal output unit 122 outputs the 3rd_SREF_PULSE and the OSC3. That is, the pulse generating unit 122-1 outputs the 3rd_SREF_PULSE as the voltage level of the 3rd_SREF changes from a low level to a high level. In addition, the delay unit 122-2 delays the 3rd_SREF to output the 3rd_SREF_DLY. Then, the 3rd_SREF_DLY and the OSC2 are subjected to a logical product through a NAND gate ND31 to then pass though the fifth inverter IV35, and the OSC3 is output.

When it is assumed that among the SEL<0:3>, only the SEL<1> is set to a high level, and the 3rd_SREF_PULSE and the OSC3 are selected by the selecting unit 210 of FIG. 6, the period detecting unit 220 detects the period of the OSC using the 3rd_SREF_PULSE and the OSC3.

That is, when a semiconductor memory enters a test mode for detecting the period of the OSC, the TM_REFOSC is enabled at a high level. As shown in FIG. 7, while the latch circuit 221 of the period detecting unit 220 outputs the MEAS_OSC at a low level, it outputs the MEAS_OSC at a high level when the 3rd_SREF_PULSE is enabled at a high level. In addition, when the OSC3 is enabled at a high level, the MEAS_OSC is output at a low level.

Accordingly, the MEAS_OSC is output to the test equipment through a pad outside the semiconductor memory, and the test equipment measures the period of the OSC using a high level interval of the MEAS_OSC.

That is, in order to resolve the problems according to the related art that occur because the period is detected by the first pulse of the OSC, in the first embodiment of the present invention, the period of the OSC is detected by one of the pulses of the OSC subsequent to the first pulse of the OSC, that is, the second to fifth pulses OSC2 to OSC5. As such, one timing is allowed to be selected from among a number of timings such that the various operational variables or differences in product characteristics can be overcome.

When the test mode for detecting the period of the OSC is completed, the TM_REFOSC is disabled to a low level. Therefore, the transistor M41 of the period detecting unit 220 resets the MEAS_OSC.

Meanwhile, in the case of a temperature-compensation-type oscillator among oscillators which generate the OSC, since a temperature sensing operation is performed during a first period, the waveforms of the OSC may be unstable until the second waveform of the OSC. Therefore, in this case, waveforms subsequent to the second waveform are preferably used.

Figure 8:
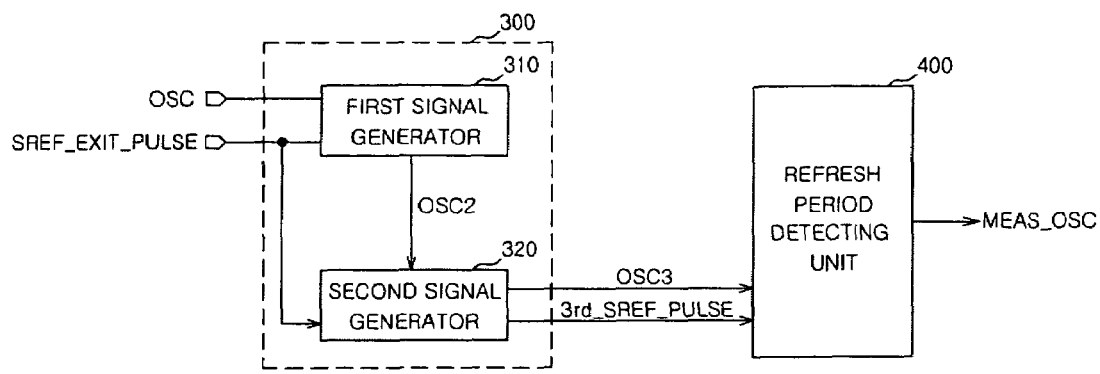
FIG. 8 is a block diagram illustrating the structure of an apparatus for detecting a refresh period of a semiconductor memory according to a second embodiment of the present invention.

As shown in FIG. 8, an apparatus for detecting a refresh period of a semiconductor memory according to a second embodiment of the present invention includes a signal generating unit 300 and a refresh period detecting unit 400. The signal generating unit 300 generates first and second reference signals (hereinafter, referred to as 3rd_SREF_PULSE and OSC3) corresponding to a predetermined order using a first pulse of the OSC, and the refresh period detecting unit 400 detects a period of the OSC using the 3rd_SREF_PULSE and the OSC3.

The second embodiment of the present invention provide an apparatus for detecting the refresh period of a semiconductor memory detecting period of the OSC using the OSC pulse that is pre-set its order. The structure according to the second embodiment can be simplified as compared with the structure according to the first embodiment.

The signal generating unit 300 includes a first signal generator 310 and a second signal generator 320. Since the first signal generator 310 has substantially the same structure as that shown in FIG. 4 and the second signal generator 320 has the same structure as that shown in FIG. 5, the descriptions thereof will be omitted.

Meanwhile, unlike the structure shown in FIG. 4, in the structure of the first signal generator 310 a pulse generating unit does not need to be provided, and an output terminal of the pulse generating unit does not need to be provided.

Figure 9:
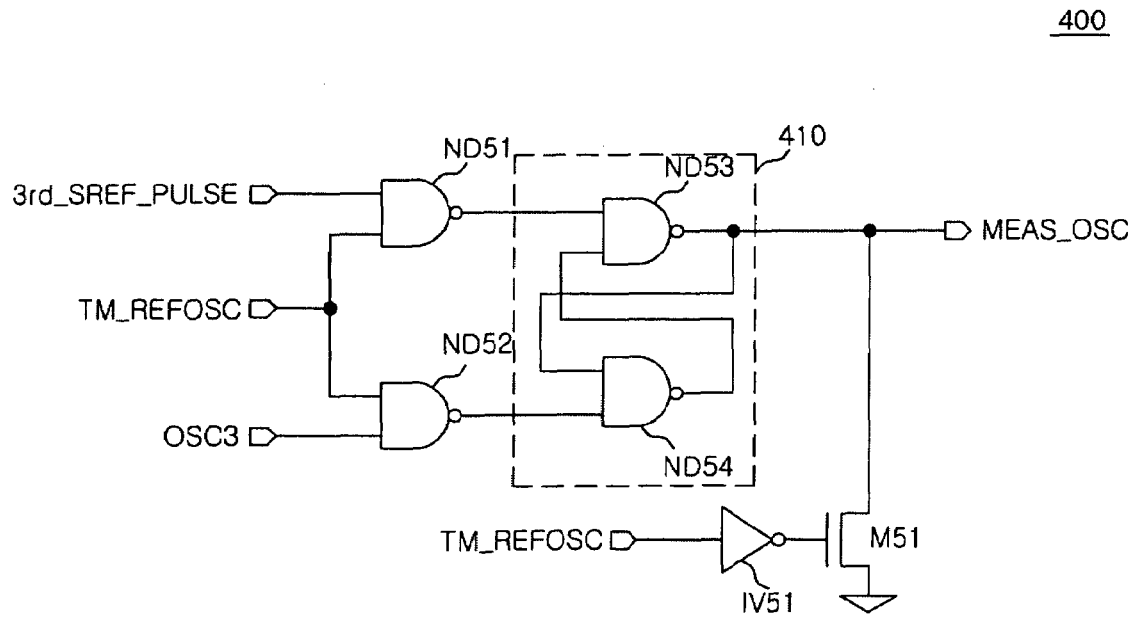
FIG. 9 is a circuit diagram illustrating the structure of the refresh period detecting unit of FIG. 8.

As shown in FIG. 9, the refresh period detecting unit 400 includes a first NAND gate ND51 that receives the 3rd_SREF_PULSE and the TM_REFOSC, a second NAND gate ND52 that receives the OSC3 and the TM_REFOSC, a latch circuit 410 that receives the output of the first NAND gate ND51 and the second NAND gate ND52, and outputs the MEAS_OSC in which a predetermined level is maintained during a period ranging from a time point when the 3rd_SREF_PULSE becomes enabled to a time point when the OSC3 becomes enabled, an inverter IV51 that receives the TM_REFOSC, and a transistor M51 having a drain coupled with an output terminal of the latch circuit 410, a source coupled with a ground terminal, and a gate receiving the output of the inverter IV51.

The latch circuit 410 includes a third NAND gate ND53 whose first input terminal receives the output of the first NAND gate ND51; and a fourth NAND gate ND54 that receives the output of the second NAND gate ND52 and the third NAND gate ND53, and which outputs a signal to a second input terminal of the third NAND gate ND53. When the TM_REFOSC is disabled to a low level, the transistor M51 resets the MEAS_OSC to a low level.

The operation of the second embodiment of the present invention that has the above-described structure will now be described with reference to FIG. 7.

First, the first signal generator 310 of the signal generating unit 300 outputs the OSC2 that is synchronized with a second pulse of the OSC.

In the second signal generator 320, the 3rd_SREF is generated in response to the OSC2, the 3rd_SREF-PULSE is generated using the 3rd_SREF, the 3rd_SREF is delayed for a predetermined time, a logical product is performed on the 3rd_SREF and the OSC2, and the OSC3 is output.

The refresh period detecting unit 400 detects the period of the OSC using the 3rd_SREF-PULSE and the OSC3.

That is, when the semiconductor memory enters a test mode for detecting the period of the OSC, the TM_REFOSC is enabled at a high level.

As shown in FIG. 7, while the refresh period detecting unit 400 outputs the MEAS_OSC at a low level, it outputs the MEAS_OSC at a high level when the 3rd_SREF-PULSE is enabled at a high level. In addition, when the OSC3 is enabled at a high level, the refresh period detecting unit 400 outputs the MEAS_OSC at a low level.

Accordingly, the MEAS_OSC is output to the test equipment through a pad outside the semiconductor memory, and the test equipment measures the period of the OSC using a high level interval of the MEAS_OSC.

When the test mode for detecting the period of the OSC is completed, the TM_REFOSC is disabled to a low level. Accordingly, the transistor M51 of the period detecting unit 400 resets the MEAS_OSC.

The apparatus for detecting the refresh period of the semiconductor memory according to the second embodiment detects the period of the OSC using the OSC pulse of the specific order i.e., the third OSC pulse.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds are therefore intended to be embraced by the claims.

An apparatus for detecting a refresh period of a semiconductor memory and a method of detecting the same according to the embodiments of the present invention can achieve the following effects.

First, since the refresh period is detected using the reference signal corresponding to the third pulse or pulses after the second pulse of the OSC, it is possible to improve accuracy and reliability in refresh period detection.

Second, since the period detection timing can be selected, the difference in various operational variables and product characteristics can be overcome, which results in stable refresh period detection.

What is claimed is:

1. An apparatus for detecting a refresh period of a semiconductor memory, comprising:
   a signal generating unit configured to generate a plurality of signal pairs, each signal pair includes one of a plurality of first reference signals that are respectively generated with the same timing as first to (N−1) pulses of a refresh period signal of order N, and one of a plurality of second reference signals that correspond to the plurality of first reference signals and are respectively generated with the same timing as second to N pulses of the refresh period signal; and
   a refresh period detecting unit configured to detect a period of the refresh period signal using one of the plurality of signal pairs.

2. The apparatus of claim 1,
wherein the signal generating unit comprises a plurality of signal generators, each signal generator configured to generate a first reference signal corresponding to each order of the refresh period signal or a second reference signal of a previous order, and a second reference signal corresponding to each order at a timing corresponding to second to N pulses of the refresh period signal.

3. The apparatus of claim 2,
wherein each of the plurality of signal generators comprises:
a detecting unit configured to detect an enable timing of the refresh period signal or the second reference signal of the previous order and to provide an output based thereon; and
a reference signal output unit configured to output the first reference signal and the second reference signal using the output of the detecting unit.

4. The apparatus of claim 3,
where the detecting unit comprises:
an inverter configured to receive the refresh period signal or the second reference signal of the previous order and to produce an output;
a first transistor having a source coupled with a power supply terminal, a drain, and a gate configured to receive the output of the inverter; and
a latch circuit coupled with the drain of the first transistor and providing an output.

5. The apparatus of claim 4, further comprising:
a reset unit configured to reset the output of the latch circuit in response to a refresh completing command.

6. The apparatus of claim 5,
wherein the reset unit comprises:
a second transistor having a drain coupled with the drain of the first transistor, a source coupled with a ground terminal, and a gate configured to receive the refresh completing command.

7. The apparatus of claim 3,
wherein the reference signal output unit comprises:
a pulse generating unit configured to generate the first reference signal corresponding to each order in response to the output of the detecting unit;
a delay unit configured to delay the first reference signal for a predetermined time to provide an output; and
a logical circuit configured to perform a logical product on the output of the delay unit and the refresh period signal and output the second reference signal corresponding to each order.

8. The apparatus of claim 1,
wherein the refresh period detecting unit comprises:
a selecting unit configured to select one of the plurality of signal pairs according to a selection signal; and
a period detecting unit configured to detect the period of the refresh period signal using the signal pair selected by the selecting unit.

9. The apparatus of claim 8,
wherein the selecting unit comprises:
a plurality of switching units, each of which being configured to receive one of the plurality of signal pairs and output the signal pair according to a corresponding bit in the selection signal.

10. The apparatus of claim 9,
wherein each of the switching units comprises:
a first pass gate having an input terminal configured to receive the first reference signal of each corresponding signal pair and a control terminal configured to receive each corresponding selection signal bit; and
a second pass gate having an input terminal configured to receive the second reference signal of each corresponding signal pair, and a control terminal configured to receive the selection signal bit.

11. The apparatus of claim 8,
wherein the period detecting unit comprises:
a first NAND gate configured to receive the first reference signal and a test mode signal and to produce an output based thereon;
a second NAND gate configured to receive the second reference signal and the test mode signal and to produce an output based thereon; and
a latch circuit configured to receive the output of the first NAND gate and the second NAND gate, and output from an output terminal a period signal in which a predetermined level is maintained during a period ranging from a time point when the first reference signal is enabled to a time point when the second reference signal is enabled.

12. The apparatus of claim 11, further comprising:
a reset unit configured to reset the period signal in response to the test mode signal.

13. The apparatus of claim 12,
wherein the reset unit comprises:
an inverter configured to receive the test mode signal and to produce an output; and
a transistor having a drain coupled with the output terminal of the latch circuit, a source coupled to a ground terminal, and a gate configured to receive the output of the inverter.

14. A method of detecting a refresh period of a semiconductor memory, comprising:
generating a plurality of reference signals that are respectively synchronized with at least two pulses corresponding to pulses subsequent to a first pulse of a refresh period signal of order N in which pulses are generated with a predetermined period; and
selecting one from the plurality of reference signals, and detecting the period of the refresh period signal using the pulse of the refresh period signal that is generated at timing before the timing of the selected reference signal.

15. The method of claim 14,
wherein the generating of the plurality of reference signals comprises:
detecting that the refresh period signal is enabled, delaying a corresponding level of the refresh period signal for a predetermined time, and generating a logical product of the delayed result and the refresh period signal so as to generate a reference signal; and
detecting that the reference signal is enabled, delaying a corresponding level of the reference signal for a predetermined time, and generating a logical product of the delayed result and the reference signal so as to generate a reference signal corresponding to each order.

16. The method of claim 15, further comprising:
detecting that the reference signal of a previous order is enabled, delaying a corresponding level of the reference signal for a predetermined time, and generating a logical product of the delayed result and the reference signal of the previous order so as to generate a reference signal corresponding to each order.

17. The method of claim 14,
wherein the detecting of the period comprises:
generating a pulse that is synchronized with an enable timing of the reference signal corresponding to an order earlier than the order of the selected reference signal, and
generating a period detecting signal in which a predetermined level is maintained during a predetermined interval ranging from an enable timing of the pulse to the enable timing of the selected reference signal.

18. An apparatus for detecting a refresh period of a semiconductor memory, comprising:
a signal generating unit configured to generate a first reference signal having the same enable timing as a (N−1) pulse of a refresh period signal of order N using a first pulse of the refresh period signal in which pulses are periodically generated, and a second reference signal having the same enable timing as an N pulse corresponding to an order of a pulse subsequent to the first pulse among the pulses of the refresh period signal; and
a refresh period detecting unit configured to detect a period of the refresh period signal using the first reference signal and the second reference signal.

19. The apparatus of claim 18,
wherein the signal generating unit comprises:
a first signal generator configured to generate a signal whose periodic pulse is generated from a timing when a second pulse of the refresh period signal is generated, using the first pulse of the refresh period signal, and
a second signal generator configured to generate the first reference signal where a pulse having the same enable timing as a second pulse of the refresh period signal is generated, and the second reference signal where a periodic pulse is generated from a timing when a third pulse of the refresh period signal is generated, using the output of the first signal generator.

20. The apparatus of claim 19,
wherein the first signal generator comprises:
an inverter configured to receive the refresh period signal and produce an output;
a first transistor having a source coupled with a power supply terminal, a drain and a gate configured to receive the output of the inverter;
a latch circuit configured to be coupled with the drain of the first transistor and to produce an output;
a pulse generating unit configured to generate the pulse in response to the output of the latch circuit;
a delay unit configured to delay the output of the latch circuit for a predetermined time to produce an output; and
a logical circuit configured to generate a logical product on the output of the delay unit and the refresh period signal and output the result of the logical product.

21. The apparatus of claim 20, further comprising:
a reset unit configured to reset the output of the pulse generating unit in response to a refresh completing command.

22. The apparatus of claim 21,
wherein the reset unit comprises:
a second transistor having a drain coupled with the drain of the first transistor, a source coupled with a ground terminal, and a gate configured to receive the refresh completing command.

23. The apparatus of claim 19,
wherein the second signal generator comprises:
an inverter configured to receive the signal from the first signal generator to produce an output;

a first transistor having a source coupled with a power supply terminal, a drain and a gate configured to receive the output of the inverter;

a latch circuit configured to be coupled with the drain of the first transistor and to produce an output;

a pulse generating unit configured to generate the pulse in response to the output of the latch circuit;

a delay unit configured to delay the output of the latch circuit for a predetermined time; and a logical circuit configured to perform a logical product on the output of the delay unit and the output of the first signal generator and output the second reference signal.

24. The apparatus of claim 23, further comprising:
a reset unit configured to reset the first reference signal in response to a refresh completing command.

25. The apparatus of claim 24,
wherein the reset unit comprises:
a second transistor having a drain coupled with the drain of the first transistor, a source coupled with a ground terminal, and a gate configured to receive the refresh completing command.

26. The apparatus of claim 18,
wherein the refresh period detecting unit comprises:
a first NAND gate configured to receive the first reference signal and a test mode signal and to produce an output based thereon;

a second NAND gate configured to receive the second reference signal and the test mode signal and to produce an output based thereon; and a latch circuit configured to receive the output of the first NAND gate and the second NAND gate, and output from an output terminal a period signal in which a predetermined level is maintained during an interval of time ranging from a time point when the first reference signal is enabled to a time point when the second reference signal is enabled.

27. The apparatus of claim 26,
wherein the latch circuit comprises:
a third NAND gate having a first input terminal receiving the output of the first NAND gate, a second input terminal and configured to produce an output; and a fourth NAND gate configured to receive the output of the second NAND gate and the third NAND gate, and to provide its output to the second input terminal of the third NAND gate.

28. The apparatus of claim 26, further comprising:
a reset unit configured to reset the period signal in response to the test mode signal.

29. The apparatus of claim 28,
wherein the reset unit comprises:
an inverter configured to receive the test mode signal and to produce an output based thereon; and a transistor having a drain coupled with the output terminal of the latch circuit, a source coupled with a ground terminal, and a gate configured to receive output of the inverter.

30. A method of detecting a refresh period of a semiconductor memory, comprising:
generating a pulse having the same enable timing as a second pulse of a refresh period signal of order N, using a first pulse of the refresh period signal in which pulses are periodically generated;

generating, using the pulse, a first reference signal having the same enable timing as an (N−1) pulse corresponding to an order of a pulse subsequent to the first pulse of the refresh period signal and a second reference signal having the same enable timing as an N pulse of the refresh period signal; and detecting a period of the refresh period signal using the first reference signal and the second reference signal.

31. The method of claim 30,
wherein the generating of the pulse comprises:
delaying the first pulse of the refresh period signal for a predetermined time, and generating a logical product from the delayed result and the refresh period signal.

32. The method of claim 30,
wherein the generating of the second reference signal comprises:
delaying the first reference signal for a predetermined time and generating a logical product from the delayed result and the refresh period signal.

33. The method of claim 30,
wherein the detecting of the period comprises:
outputting a period detecting signal in which a predetermined level is maintained during a predetermined interval of time ranging from a time point when the first reference signal is enabled to a time point when the second reference signal is enabled.

* * * * *